United States Patent [19]

Caule

[11] 3,950,193

[45] Apr. 13, 1976

[54] TARNISH RESISTANT COPPER AND COPPER ALLOYS

[75] Inventor: Elmer J. Caule, New Haven, Conn.

[73] Assignee: Olin Corporation, New Haven, Conn.

[22] Filed: Aug. 5, 1974

[21] Appl. No.: 494,736

Related U.S. Application Data

[63] Continuation of Ser. No. 147,673, May 27, 1971, abandoned.

[52] U.S. Cl............ 148/31.5; 148/6.15 R; 148/6.31; 428/336; 428/469
[51] Int. Cl.$^2$...................... C23F 7/12; B32B 15/04
[58] Field of Search............ 148/31.5, 6.15 R, 6.31; 428/469, 336

[56] References Cited
UNITED STATES PATENTS

| | | | |
|---|---|---|---|
| 1,426,771 | 8/1922 | Radu................................... | 148/31.5 |
| 1,895,175 | 1/1933 | Staples............................... | 148/31.5 |
| 2,120,212 | 6/1938 | Curtin................................. | 148/31.5 |
| 3,434,889 | 3/1969 | Haroldson et al. ................ | 148/6.31 |

Primary Examiner—William J. Van Balen
Assistant Examiner—Charles E. Lipsey
Attorney, Agent, or Firm—David A. Jackson; Robert H. Bachman

[57] ABSTRACT

A method of producing a laminate having high bond strength and excellent resistance to acid undercutting comprising oxidizing copper or its alloys to form an oxide film, applying a phosphoric acid solution to the oxide film, rinsing, drying, and adhesively laminating to a plastic film. The instant case also teaches a method of producing high tarnish resistance on copper and its alloys by so oxidizing and phosphating and further teaches a flexible printed circuit wherein the unwanted copper portion of the formed laminate is etched away, characterized by high peel strength and substantially no acid undercutting of the formed circuitry.

9 Claims, No Drawings

TARNISH RESISTANT COPPER AND COPPER ALLOYS

This is a continuation of application Ser. No. 147,673, filed May 27, 1971, now abandoned.

BACKGROUND OF THE INVENTION

The present invention relates specifically to metal plastic laminates having high bond strength and improved resistance to acid undercutting during manufacture of laminates into flexible printed circuits.

The present invention further broadly relates to treating copper and copper alloys to form a tarnish and oxidation resistant film thereon.

In the manufacture of flexible printed circuits copper foil or sheet is employed which normally has on its surface a film of an organic inhibitor, such as benzotriazole, in order to prolong the shelf life before manufacture of the circuitry board.

Flexible printed circuits comprise copper sheets or copper foil bonded to the surface of a plastic sheet, such as a polyester or polyimide. Normally two types of copper foil, either wrought annealed or electro deposited, are employed in the manufacture of flexible printed circuits.

Printed circuits find wide use in the electrical and electronic fields since they are advantageous in the elimination of individual lead wires which require a separate soldering or other joining operation to the various components of any particular circuit. The configuration of such a circuit facilitates the positioning of conventional circuit components such as capacitors, etc., and the soldering of these components to the wiring by a dipping operation.

The manufacture of flexible printed circuits comprises adhesively bonding copper sheet or foil to a plastic film, such as a polyester or polyimide, and generally employing a suitable glue. As one preferred way the copper side of the resultant, laminate is then sprayed with a photo resist and the required circuit is projected onto the coated side of the copper component which transforms the photo resist into an acid insoluble compound in a figure and likeness of the circuit. The laminate is then immersed or sprayed with an acid etchant, such as a ferric chloride solution, to dissolve away the unwanted portion of the copper, i.e., that portion of the copper component of the laminate which is not part of the required circuitry.

Various problems arise however in the present manufacture of flexible printed circuits to which the present invention is directed.

For example, in order to provide tarnish resistance of copper foil and an acceptable laminated product before laminating, a film of an organic inhibitor is normally applied to the surface of the copper.

The organic inhibitor, e.g., benzotriazole, provides for long shelf life or stability during storage.

Before laminating of a wrought hard copper to the plastic film it is advantageous to anneal the copper in order to provide increased ductility which is highly desirable in flexible printed circuits. It has been found that the organic inhibitor upon the copper surface decomposes during the annealing. Due to this decomposition problems arise such as the effect of the benzotriazole is no longer apparent and therefore the product no longer has good shelf life and tarnishing occurs. The tarnishing causes poor laminate bond strength, uneven acid etching, and rapid acid undercutting along the bonded interface during etching away of the unwanted copper portion of the laminate. The acid undercutting generally occurs at a rate equivalent to at least thirty mils per hour from each side of the copper circuitry, at the aforementioned interface, and materially degrades the quality of the printed circuit.

Furthermore, unless treated the copper-foil plastic laminate exhibits poor bond strength when room temperature oxidation or tarnishing occurs on the foil. Furthermore, the resistance to acid undercutting along the interface of the wrought annealed foil is poor as aforementioned. A further complication with wrought annealed and other foil arises with the use of organic inhibitors such as benzotriazole, since residual benzotriazole on the unbonded side of the foil results in uneven etching of the circuit because the benzotriazole provides some inhibition in the etching solution. A still further disadvantage with organic inhibitors occurs with certain plastic systems wherein high temperatures, i.e., above 240°F, are employed for curing of the glue. These high temperatures cause the copper-organic inhibiting film to decompose with the formation of relatively large amounts of gases which causes blistering of the laminate and thereby producing an unacceptable product.

It is well known, as aforementioned, that copper and many of its alloys possess low resistance to tarnishing in many atmospheres and particularly atmospheres containing industrial wastes such as compounds of sulfur. It is therefore required, in order to provide a measure of tarnish resistance for a relatively prolonged period of time, that a film of an organic inhibitor, such as benzotriazole, be applied to the surface of the copper or copper alloy.

The application of such inhibitors provides for prolonging the aesthetic appeal or copper materials in finished form, such as lamp bases and other consumer goods for the home, and also provides for long shelf life before further manufacture of such materials into final consumer articles. This is particularly important since prolonged exposure of copper materials in an industrial environment naturally degrades the exposed surfaces resulting in build up of corrosion products, such as copper sulfides copper oxides, etc. which may necessitate a severe mechanical or chemical cleaning operation in order to restore the material surface to a condition compatible for normal further cleaning and manufacturing operations, e.g., a simple alkaline clean or degreasing cycle before additional mechanical working of the material.

It is therefore a principle object of the present invention to provide a copper, or copper alloy, sheet or foil adhesively bonded to a plastic film to form a laminate which has increased resistance to acid undercutting and uneven dissolution of the unwanted copper during manufacture of the laminate into a flexible circuit.

It is an additional object of the present invention to provide a method for providing increased tarnish resistance of copper and its alloys.

It is a further object to provide a flexible printed circuit which is characterized by no substantial undercutting of the circuitry and by high bond or peel strength and tarnish resistance without degradation of other properties so desirable in flexible printed circuitry.

It is still a further object of the present invention to provide the objects as aforesaid conveniently, expeditiously and inexpensively.

Further objects and advantages of the present invention will become apparent hereinafter.

SUMMARY OF THE INVENTION

The present invention comprises oxidizing a surface of copper foil or sheet to form an oxide film of 150 to 1000 Angstrom units in thickness, applying a phosphoric acid solution to the oxide film to form a glass like film of copper phosphate, rinsing and drying the foil or sheet, and then adhesively bonding the foil or sheet to a plastic film to form a laminate.

The present invention also provides for further forming of the laminate into a flexible printed circuit. A preferred method of forming of the flexible printed circuit is by applying a photoresist to the surface of the aforementioned foil or sheet opposing the surface bonded to the plastic film, projecting the desired circuitry upon the photo resist to form an acid insoluble compound in the area of the required circuitry, dissolving away the unwanted copper in an acidic solution and then rinsing and drying.

The present invention additionally provides for highly tarnish resistant copper or alloy thereof having on its surface a glassy like and substantially pore free film of copper phosphate from 20 to 1000 Angstrom Units thick. When the aforementioned copper or copper alloy is adhesively bonded to a plastic film as, for example, in the form of a flexible printed circuit, the printed circuit is characterized by stable high bond strength and substantially no acid undercutting of the copper circuitry in the bonded interface.

It is a particular advantage of the present invention that the treated wrought copper foil or sheet can be annealed prior to the aforementioned adhesively bonding step, which provides the advantage of high ductility of a wrought-annealed copper foil or sheet product.

It is to be noted that the present invention also broadly relates to highly tarnish resistant copper or an alloy thereof which possess long shelf life and therefore materially reduces requisite cleaning of a fully manufactured and treated copper article as well as copper or copper alloy which requires further manufacturing or processing into finished articles, such as laminates and flexible printed circuits.

DETAILED DESCRIPTION OF THE INVENTION

The aforementioned oxidation step is such as to provide an oxide layer on at least one surface of the copper sheet or foil, i.e. that surface to be bonded to the plastic film, of from about 150 to 1000 Angstrom Units in thickness.

The oxidation is preferably carried out by heating of the copper sheet, in an environment containing oxygen or wherein air has not been excluded, at a temperature from about 200° to 340°C for about 5 to 45 minutes in order to form the requisite oxide film.

Following the oxidation step the copper sheet or foil is phosphated by applying a phosphoric acid solution, such as by immersion, to the oxidized surface. The acid normally employed is from about 15 to 85% concentration, and most normally concentrated, phosphoric acid having the formula $H_3PO_4$, although a solution of phosphates such as acid solutions of sodium ($Na_2HPO_4$), potassium ($K_2HPO_4$), and lithium ($LiH_2PO_4$) may also be readily employed in a concentration range normally corresponding to 15% of phosphoric acid of the formula $H_3PO_4$ up to their solubility limits in water.

The temperature of the phosphoric acid solution is normally ambient for practical considerations but may range from below that of room up to substantially the boiling point. the phosphating solution may also be suitably agitated, if desired, by conventional mechanical means.

Following the phosphating step the copper sheet is rinsed and dried. The rinsing is normally carried out in running water although a spray rinse may also be readily employed. Drying is accomplished by an air blast, rinsing in an alcohol solution such as methanol and allowing to dry, or merely by allowing to dry by exposure to the atmosphere.

Following rinsing and drying the treated surface of the copper sheet, or foil, is adhesively bonded to a plastic film, such as by employing a high temperature glue, in order to form a laminate.

In this embodiment the resultant laminate comprising copper sheet or foil and a plastic film is particularly useful in the manufacture of flexible printed circuitry. Although not critical the preferred plastic film comprises a polyester or polyimide organic compound, and in particular Mylar and Kapton, respectively.

Preferably but not necessarily, before the aforementioned bonding the copper foil or sheet is recrystallized annealed in a reducing atmosphere at a temperature from about 250° to 500°F for at least about eight minutes, and preferably not longer than about 16 hours when at a temperature of about 250° to 350°F, and preferably not longer than about one-half hour when at a temperature in the aforementioned range in excess of about 350°F.

A further embodiment of the present invention is the applying of a photo resist to the unbonded surface of the copper component of the aforementioned laminate and then conventionally impressing a pattern of the required circuitry which transforms the photo resist to an acid insoluble compound at the area of the impressed circuitry.

The unwanted copper is then dissolved away by a suitable acid such as acid ferric chloride, in those areas of the laminate wherein the photo resist has not been transformed into an acid insoluble compound during projection of the circuitry. The laminate is then rinsed and dried and thereby a completed flexible circuit is formed.

The copper provided in forming the flexible printed circuit of the present invention is normally from about 0.25 to 6 mils in thickness and is in the annealed condition and may be any suitable copper or alloy thereof which is capable of carrying the required current for the intended application. Normally CDA Alloy 110 (99.90% minimum copper, 0.04 nominal oxygen) or CDA Alloy 102 (99.95% minimum copper) is employed. Naturally, it is also preferred that the sheet or foil be suitably cleaned before oxidizing.

When bonding of copper or foil sheet to a polyester film, such as Mylar, is desired it is necessary to roughen the surface of the copper which is to be bonded to the polyester before oxidizing the copper sheet.

The roughening is preferably such as to provide a surface having an average roughness, in the case of a polyester, of about one to 20 micro inches, RMS.

The roughening may be provided by acid etching, by pack rolling, by rolling with suitably roughened rolls, or by abrasive blasting.

If acid etching is employed any suitable acid which is oxidizing in nature such as nitric or air saturated sulfuric acid may be utilized. The particular concentration, temperature, and time of etching is not particularly critical so long as the aforementioned depth of etching is achieved, and naturally various combinations of acid, temperatures, and times are contemplated. For example, an immersion time of from about one minute to about 10 minutes in a 10% nitric acid solution has been found to be suitable.

Should a polyimide plastic film be employed the copper surface may also be roughened as aforementioned but is preferred smooth.

It has been surprisingly found that the present invention provides for a high quality circuit laminate wherein acid undercutting of the copper circuitry is reduced to an acceptable level and frequently to nil.

The circuit laminate of the present invention is also characterized by having high bond strength as a result of the aforementioned treatment, as well as substantially no acid undercutting of the circuitry at each side of the circuitry wherein the circuitry is adhesively bonded to the plastic film at the bonded interface. The good bond strength and acid undercutting resistance are not degraded by long time exposure to the atmosphere.

The circuit, as well as the laminate and copper or copper alloy, of the present invention is further characterized by having uniformly thereon a glassy like, and pore free, copper phosphate coating of a thickness of from about 20 to 1000 Angstrom Units and readily overcomes the aforementioned disadvantages of high acid undercutting and of low bond strength as well as other disadvantages of the prior art.

For example, in the manufacture of flexible printed circuits electrodeposited copper foil is frequently employed in place of wrough annealed copper wherein one side, or sufrace, of the foil is relatively rough. Such rough surface is oxidized and then both sides of the electrodeposited copper foil are treated with the aforementioned inhibitor. The inhibitor forms a copper salt when it reacts with the copper oxide present on both sides of the foil, intentionally on the rough side and as a residual on the other or smooth side. This residual benzotriazole salt on the smooth side causes uneven etching response of the copper foil plastic laminate.

Electrodeposited copper is also disadvantageous when bonded to a polyester film since the foil is generally of low ductility whereas a relatively high ductile material, such a rolled and annealed copper, is desirable in flexible printed circuitry wherein a polyester film, such as Mylar, is employed.

Furthermore, electrodeposited copper does not tend to uniformly etch away in the unwanted areas of the copper component during formation of the circuitry due to its relatively large grain size; whereas the more uniform, and fine grain size, of rolled and annealed copper tends to provide for more even etching which is preferred in the forming of high quality circuitry.

Electrodeposited copper inhibited by benzotriazole is also disadvantageous when bonding to a polyimide plastic film since the polyimide films, such as Kapton, require a curing temperature which is sufficiently high to promote degragation of the copper benzotriazole salt thereby degrading or destroying the laminate. Therefore rolled copper foil is used with the polyimides rather than electrodeposited inhibited copper.

It is also noted that the flexible circuit of the present invention may readily be soft soldered over the aforementioned film thus providing for increased economy in assembling of composite electrical circuitry.

It is further noted that as a result of the aforementioned treatment of oxidizing plus phosphating that copper and its alloys have very high tarnish resistance and therefore long shelf life prior to laminating as well as prolonged aesthetic value since the normal corrosion products produced in polluted atmospheres are reduced.

In addition the method of the present invention of forming a film of copper phosphate on copper and its alloys has also been surprisingly found to prevent sticking together of the metal sheets during annealing, which thus overcomes a prevalent problem during mill processing.

The present invention will become more readily apparent from the following illustrative examples.

EXAMPLE I

The present example describes the method of laminating and testing of samples for peel strength and acid undercutting when laminating to a polyester.

CDA Copper 110 foil was degreased by swabbing with benzene. It was then brought into contact with a polyester (Mylar) sheet 3/1000 inch thick covered with 1/10 of 1/1000 inch thermo plastic glue and heat and pressure were applied to effect a bond between the glue and the metal. From the sheet so manufactured, strips 1 cm wide and 10 cm long were cut for testing of the bonding strength between plastic and metal and squares 2 cm on a side were cut for testing the resistance of the bond to undercutting by dilute hydrochoric acid. The bonding strength, or "peel" strength, was measured by attaching the plastic by means of doubled sided adhesive tape to the rim of a freely-pivoted wheel of radius 6 inches and thickness 1 inch, then slightly freeing a short section of the metal from the plastic, attaching the free end of the metal to a spring balance and then pulling the metal radially from the wheel while simultaneously reading the balance; this arrangement insures that the metal will separate perpendicularly from the plastic.

The undercutting test is performed by immersing the square of laminate in 10% hydrochloric acid in water for definite periods of time conventionally taken here as 1 hour and at the end of that time reading the width of the separation of plastic from metal by means of a magnifying eyeglass fitted with a ruled grating to enable lengths to be measured to an accuracy of 1/1000 inch. The peel strength is reported as the force of separation in pounds per inch of width which requires the experimental results obtained as above to be multiplied by 2.54 and the rate of undercutting is reported as 1/1000 inch per hour.

EXAMPLE II

As a comparative example to the present invention smooth annealed CDA copper 110 which had, before annealing, been cold rolled to a thickness such that one square foot of the copper foil weighed 1 oz., was laminated to polyester (Mylar) film 3/1000 inch thick by means of a thermo plastic glue as in Example I. Before lamination the copper foil had been degreased by swabbing with benzene of reagent grade. The peel strength as measured in Example I was determined to be 8.8 lbs./inch and the acid undercutting rate was 150/1000 inch per hr.

EXAMPLE III

As a comparative example to the present invention smooth annealed CDA copper 110, cold rolled before annealing to a weight of 1 oz/sq. ft., was degreased with benzene of reagent grade and left in the open air for 3 days indoors. At the end of that time it was laminated as in Example I to Mylar 3/1000 inch thick and tested for peel strength and for rate of undercutting. The peel strength was determined to be 2 lbs./inch and the undercutting rate was 150/1000 inch per hr.

EXAMPLE IV

The present comparative example illustrates the effect of roughening and of immediate laminating wherein a tarnish film has not had a chance to form.

Annealed CDA copper 110 which before annealing had been cold rolled to a thickness corresponding to a weight of 1 oz./sq. ft., was roughened to a roughness of 20 micro inches RMS value as determined by a stylus instrument. This copper was immediately laminated to a polyester film (Mylar) 3/1000 inch thick with a thermo plastic glue. The peel strength was determined to be 7 lbs./inch and the rate of undercutting to be 0/1000 inch per hr.

EXAMPLE V

As a comparative example to the present invention annealed CDA copper 110 which before annealing had been cold rolled to a thickness corresponding to a weight of 1 oz./sq. ft., was roughened to a roughness of 20 micro inches RMS value as determined by a stylus instrument. This copper was stored in a covered dish in laboratory air for 3 days. At the end of that time it was laminated to Mylar 3/1000 inch thick and samples were cut and tested for peel strength and for rate of undercutting. The peel strength was determined to be 3 lbs./inch and the rate of undercutting was determined to be 80/1000 inch per hr.

EXAMPLE VI

The present example is illustrative of the present invention. Annealed CDA copper 110 which before annealing had been cold rolled to a thickness corresponding to a weight of 1 oz./sq. ft., was roughened to a roughness of 20 micro inches RMS value as determined by a stylus instrument. The foil was then oxidized in air to a temperature of 270°C for 10 minutes, cooled, and immersed for 15 seconds in a solution of phosphoric acid of 84% strength. After rinsing in water and drying it was annealed at 250°C in a 4% hydrogen–96% nitrogen gas mixture for 2 hours. After cooling the foil was immediately laminated to a polyester film (Mylar) 3/1000 inch thick covered with a thermo plastic glue. Specimens were cut from the laminate and tested for peel strength and rate of acid undercutting. The peel strength was determined to be 7½ lbs/inch and the rate of undercutting was found to be 4/1000 inch per hr.

EXAMPLE VII

The present example is illustrative of the present invention.

Annealed CDA copper 110 which before annealing had been cold rolled to a thickness corresponding to a weight of 1 oz./sq. ft., was roughened to a roughness of 20 micro inches RMS value as determined by a stylus instrument. The foil was then heated in air to a temperature of 270°C for 10 minutes, cooled, and immersed for 15 seconds in a solution of phosphoric acid of 84% strength. After rinsing in water and drying it was annealed at 250°C in a 4% hydrogen–96% nitrogen gas mixture for 2 hours. After cooling the foil was stored for 2 weeks in a covered vessel in laboratory air. At the end of that time it was laminated to a polyester (Myler) film covered with a thermo plastic glue. Specimens were cut and tested for peel strength and rate of acid undercutting. The peel strength was found to be 7 lbs./inch and the rate of undercutting was measured as 5/1000 inch per hr.

EXAMPLE VIII

The following example illustrates the method of laminating and testing for peel strength and acid undercutting when bonding to a polyimide.

CDA copper 110 foil was degreased by swabbing with benzene. It was then brought into contact with a plastic film made of polyimide plastic (Kapton) with a cast glue on its surface. The metal and the plastic were passed together through heated rollers at a temperature of 200°F with a moderate pressure sufficient to lightly attach the 2 sheets together. The sandwich assembly was then placed in a platen press heated to 330°F at a pressure of about 15 lbs./sq. inch for a period of 30 minutes. From this cured assembly strips suitable for testing were cut and tests were conducted as in Example I to determine peel strength and rate of undercutting. The results are reported in the same units as were the results obtained with the Mylar film.

EXAMPLE IX

As a comparative example to the present invention smooth annealed CDA copper 110 foil in a 1 oz. weight was degreased with benzene and laminated to a polyimide film (Kapton) in a platen press. Determination of the bond strength gave the figure 2.9 lbs./inch and the rate of undercutting was found to be 50/1000 inch per hr.

EXAMPLE X

As a comparative example to the present invention smooth annealed CDA copper 110 sheet, which before annealing had been cold rolled to a weight of 1 oz./sq. ft., was degreased and exposed to laboratory air in a covered container for 3 days. At the end of that time it was laminated to a polyimide (Kapton) and samples were cut and both peel strength and acid undercutting rate were determined. The results were for peel strength 1.2 lbs./inch and for rate of undercutting 150/1000 inch per hr.

EXAMPLE XI

The present comparative example illustrates the effect of roughening and immediate laminating wherein a tarnish film has not had a chance to form.

Annealed CDA copper 110 foil which before annealing had been cold rolled to a weight of 3 oz./sq. ft., was deliberately roughened by being passed through a set of rolls, one of which had been rough ground. The surface roughness was determined by a stylus instrument to be 20 micro inches RMS. The roughened surface was immediately laminated to a sheet of polyimide (Kapton) plastic 0.003 inch thick covered with an adhesive. Samples were cut and tested and the bond strength was found to be 1.5 lbs./inch and the rate of undercutting was found to be 0/1000 inch per hr.

EXAMPLE XII

As a comperative example to the present invention annealed CDA copper 110 foil which before annealing had been cold rolled to a weight of 3 oz./sg. ft., was deliberately roughened by being passed through a set of rolls, one of which had been rough ground. The surface roughness was determined by a stylus instrument to be 20 micro inches RMS. The foil was stored in a covered dish in the laboratory air for 2 weeks. At the end of that time the roughened surface was laminated to a sheet of polyimide plastic (Kapton) and specimens were cut for testing. The bond strength was found to be 1.2 lbs./inch and the rate of undercutting was found to be 250/1000 inch per hr.

EXAMPLE XIII

The present example is illustrative of the present invention.

Annealed CDA copper 110 foil which before annealing had been cold rolled to a weight of 3 oz./sq. ft., was deliberately roughened by being passed through a set of rolls, one of which had been rough ground. The surface roughness was determined by a stylus instrument to be 20 micro inches RMS. The copper foil was then heated in air to 270°C for 10 minutes, cooled, dipped for 15 seconds into 84% phosphoric acid, washed and dried, and annealed in a 4% hydrogen–96% nitrogen gas atmosphere at 250°C for 2 hours. The resulting foil was immediately laminated to a polyimide film (kapton) covered with a cast glue, and samples were cut and tested for both bond strength and rate of undercutting. The bond strength was found to be 3 lbs./inch and the rate of undercutting was 0/1000 inch per hr.

EXAMPLE XIV

The present example is illustrative of the present invention.

Annealed CDA copper 110 foil which before annealing had been cold rolled to a weight of 3 oz./sq. ft., was deliberately roughened by being passed through a set of rolls, one of which had been rough ground. The surface roughness was determined by a stylus instrument to be 20 micro inches RMS. The copper foil was then heated in air to 270°C for 10 minutes, cooled, dipped for 15 seconds into 84% phosphoric acid, washed and dried, and annealed in a 4% hydrogen-96% nitrogen gas atmosphere at 330°C for 2 hours. The foil was then stored in a covered vessel in laboratory air for 2 weeks. At the end of that time it was laminated to a polyimide film (Kapton) and samples were cut and tested for bond strength and for rate of undercutting. Results were that the bond strength was found to be 3 lbs./inch and the rate of undercutting was determined to be 0/1000 inch per hr.

EXAMPLE XV

The present example is illustrative of the present invention.

Smooth annealed CDA copper 110 foil which before annealing had been cold rolled to a weight of 3 oz./sq. ft. was degreased, heated in air to 270°C for 10 minutes, cooled, dipped for 15 seconds in 84% phosphoric acid, washed and dried, and annealed in a 4% hydrogen-96% nitrogen gas atmosphere at 330°C for 2 hours. It was then immediately laminated to a polyimide (Kapton) film. Samples were cut and tested for bond strength and acid undercutting. The bond strength was found to be 5 lbs./inch and the rate of undercutting to be 0/1000 inch per hr.

EXAMPLE XVI

The present example is illustrative of the present invention.

Smooth annealed CDA copper 110 foil which before annealing had been cold rolled to a weight of 3 oz./sq. ft. was degreased, heated in air to 270°C for 10 minutes, cooled, dipped for 15 seconds in 84% phosphoric acid, washed and dried, and annealed in a 4% hydrogen-96% nitrogen gas atmosphere at 330°C for 2 hours. The treated foil was stored in a covered dish in laboratory air for 2 weeks and then laminated to a polyimide (Kapton) film. Samples were cut and tested for bond strength and acid undercutting. The bond strength was found to be 5 lbs./inch and the rate of undercutting to be 0/1000 inch per hr.

EXAMPLE XVII

This example relates to the alternative embodiment of the present invention wherein high tarnish resistance is imparted to copper and its alloys.

CDA copper 110 foil which before annealing had been cold rolled to a thickness corresponding to 1 oz./sq. ft. was degreased and oxidized in air at 275°C for 10 minutes. The alloy was then cooled and immersed in 84% phosphoric acid for 15 seconds, and then rinsed and dried. The treated alloy was then tested for tarnish resistance by hanging coupons about ¾ × 1½ inches over about 10 ml. of 22% by weight of ammonium sulfide solution for 15 seconds. The nonappearance of tarnish colors at the end of this time indicated that a protective film had been formed.

Thus, the present invention provides for a convenient and expeditious method for preparing copper sheet or foil having long shelf life, and for providing high bond strength and excellent resistance to acid undercutting in metal plastic laminates which is of great advantage in the preparation of flexible printed circuitry in the electric and electronic industries.

The present invention also provides a method for treating copper and its alloys which materially increases tarnish resistance, and shelf life, of these materials and thereby provides for prolonged aesthetic appeal and for reducing or eliminating normally requisite chemical or chemical cleaning operations.

This invention may be embodied in other forms or carried out in other ways without departing from the spirit of essential characteristics thereof. The present embodiment is therefore to be considered as in all respects illustrative and not restrictive, the scope of the invention being indicated by the appended claims, and all changes which come within the meaning and range of equivalency are intended to be embraced therein.

What is claimed is:

1. A tarnish resistant material consisting essentially of a material selected from the group consisting of copper and copper alloys and a uniform glassy like and substantially pore free coating consisting of copper phosphate on the surface thereof ranging in thickness from 20 to 1000 Angstrom units.

2. The material of claim 1 wherein said copper is from 6 to 0.25 mils in thickness.

3. The material of claim 1 which is in the annealed condition.

4. The material of claim 1 wherein said copper is copper foil.

5. The material of claim 1 wherein said copper is copper sheet.

6. The material of claim 1 wherein said copper is a copper alloy.

7. The material of claim 1 wherein said copper is commercial purity copper.

8. The material of claim 1 wherein at least one surface of said copper is roughened.

9. The material of claim 8 wherein said copper is roughened to an average roughness of 1 to 20 micro inches RMS.

* * * * *